United States Patent
Cramer et al.

(10) Patent No.: US 10,558,424 B1
(45) Date of Patent: Feb. 11, 2020

(54) SPEAKER DEVICE WITH EQUALIZATION CONTROL

(71) Applicant: Peag, LLC, Carlsbad, CA (US)

(72) Inventors: Winthrop Cramer, Carlsbad, CA (US); Justin Liu, San Diego, CA (US)

(73) Assignee: Peag, LLC, Carlsbad, CA (US)

( * ) Notice: Subject to any disclaimer, the term of this patent is extended or adjusted under 35 U.S.C. 154(b) by 0 days.

(21) Appl. No.: 16/457,883

(22) Filed: Jun. 28, 2019

Related U.S. Application Data

(63) Continuation of application No. 16/212,574, filed on Dec. 6, 2018, now Pat. No. 10,394,521.

(51) Int. Cl.
| | |
|---|---|
| *H04R 3/00* | (2006.01) |
| *G06F 3/16* | (2006.01) |
| *H03G 5/16* | (2006.01) |
| *H04R 1/10* | (2006.01) |

(52) U.S. Cl.
CPC .............. *G06F 3/165* (2013.01); *G06F 3/167* (2013.01); *H03G 5/165* (2013.01); *H04R 1/1041* (2013.01); *H04R 1/1008* (2013.01); *H04R 1/1016* (2013.01); *H04R 2420/07* (2013.01)

(58) Field of Classification Search
CPC .......... H04R 3/00; H04R 3/04; H04R 1/1008; H04R 1/1016; H04R 1/1041; H04R 1/1091; H04R 2420/07; G06F 3/16; G06F 3/165; G06F 3/167; H03G 5/00; H03G 5/025; H03G 5/16; H03G 5/165
See application file for complete search history.

(56) References Cited

U.S. PATENT DOCUMENTS

| | | | |
|---|---|---|---|
| 9,002,044 B2 | 4/2015 | Dinescu et al. | |
| 9,049,502 B2 | 6/2015 | Dinescu et al. | |
| 9,733,890 B2 | 8/2017 | Vansickel et al. | |
| 9,900,680 B2 | 2/2018 | Milam et al. | |
| 2008/0253583 A1* | 10/2008 | Goldstein | H04R 1/1091 381/92 |
| 2011/0103609 A1* | 5/2011 | Pelland | H04M 1/0254 381/74 |
| 2012/0231851 A1 | 9/2012 | Kuhl et al. | |
| 2014/0314245 A1* | 10/2014 | Asada | H04R 1/1083 381/71.6 |
| 2017/0046118 A1* | 2/2017 | Hsieh | G06F 3/165 |
| 2018/0063311 A1 | 3/2018 | Fathollahi et al. | |
| 2018/0242072 A1* | 8/2018 | Jones | H04R 1/1041 |
| 2019/0098390 A1* | 3/2019 | Carino | H04R 1/1016 |

* cited by examiner

*Primary Examiner* — Thang V Tran
(74) *Attorney, Agent, or Firm* — LambentIP

(57) ABSTRACT

A speaker device with equalization (EQ) control is provided, wherein the speaker device may be a pair of earbuds/earphones or a headset having a pair of headphones, comprising: an audio receiving port for receiving audio signals from an audio source, a circuitry comprising at least a processor and a memory, the processor being configured to execute one or more firmware or software programs to perform tasks for processing the audio signals, including equalization of the audio signals according to one of multiple EQ settings stored in the memory, a user input terminal for detecting a user input to select one of the EQ settings; and a pair of speaker drivers for emitting sound corresponding to the processed audio signals.

20 Claims, 7 Drawing Sheets

SPEAKER DEVICE WITH EQUALIZATION CONTROL

CROSS-REFERENCE TO RELATED APPLICATION

This application is a continuation of the U.S. patent application Ser. No. 16/212,574 filed on Dec. 6, 2018.

BACKGROUND

Audio listeners and music lovers often demand advanced sound systems, which can provide users with flexibility to customize sound attributes for enhancing the sound/music experience. Examples of such customizations of sound attributes include a volume-up and down adjustment, equalization and other audio manipulations. Equalization (EQ) refers to a process of adjusting the strength of amplitudes in specific frequency bands or frequency ranges of audio signals. The circuit or equipment used to achieve equalization is called an equalizer. An equalizer is typically configured to alter the frequency response using filters, such as low-pass filters, high-pass filters, band-pass filters, etc., enabling bass, treble and other frequency range adjustments.

Earbuds, earphones or headphones allow users to shut down surrounding noises and disturbances to enjoy hand-free audio listening, and may be wired to or wirelessly communicate with an audio source, such as a smartphone, a digital audio player (DAP), an MP3 player, a laptop computer, a tablet and other mobile communication devices. Modern wireless technologies include LTE™, Wi-Fi™ and Bluetooth®, to name a few, the developments of which have been driven by needs to eliminate cluttering physical connections and wirings, especially for users in motion. A device based on the Bluetooth standard operates for exchanging data over short distances, at frequencies between 2402 and 2480 MHz, or 2400 and 2483.5 MHz, which is referred to as the short-range radio frequency (RF) band.

Modern-day audio listeners are increasingly demanding to use a high-quality speaker device that is mobile and/or wearable, such as a pair of earbuds or earphones or a headset, and allows the users to customize the sound attributes according to their likings.

DETAILED DESCRIPTION

Modern-day audio listeners, especially those in motion, listen to their favorite pieces of music typically using a speaker device that is mobile and/or wearable, such as a pair of earbuds or earphones or a headset. Audio signals, corresponding to the sound in the form of music, spoken language, etc. can be received by the speaker device from an audio source, such as a smartphone, a digital audio player (DAP), an MP3 player, a laptop computer, a tablet and other mobile communication devices. The communication link between the speaker device and the audio source may be physically wired or wireless. Examples of wireless communication technologies include LTE, Wi-Fi and Bluetooth protocols. Audio systems can be configured to allow users to adjust the sound by controlling the on/off operation, play or pause mode selection, track forward or backward selection, volume up and down operation, etc.

Figure 1:
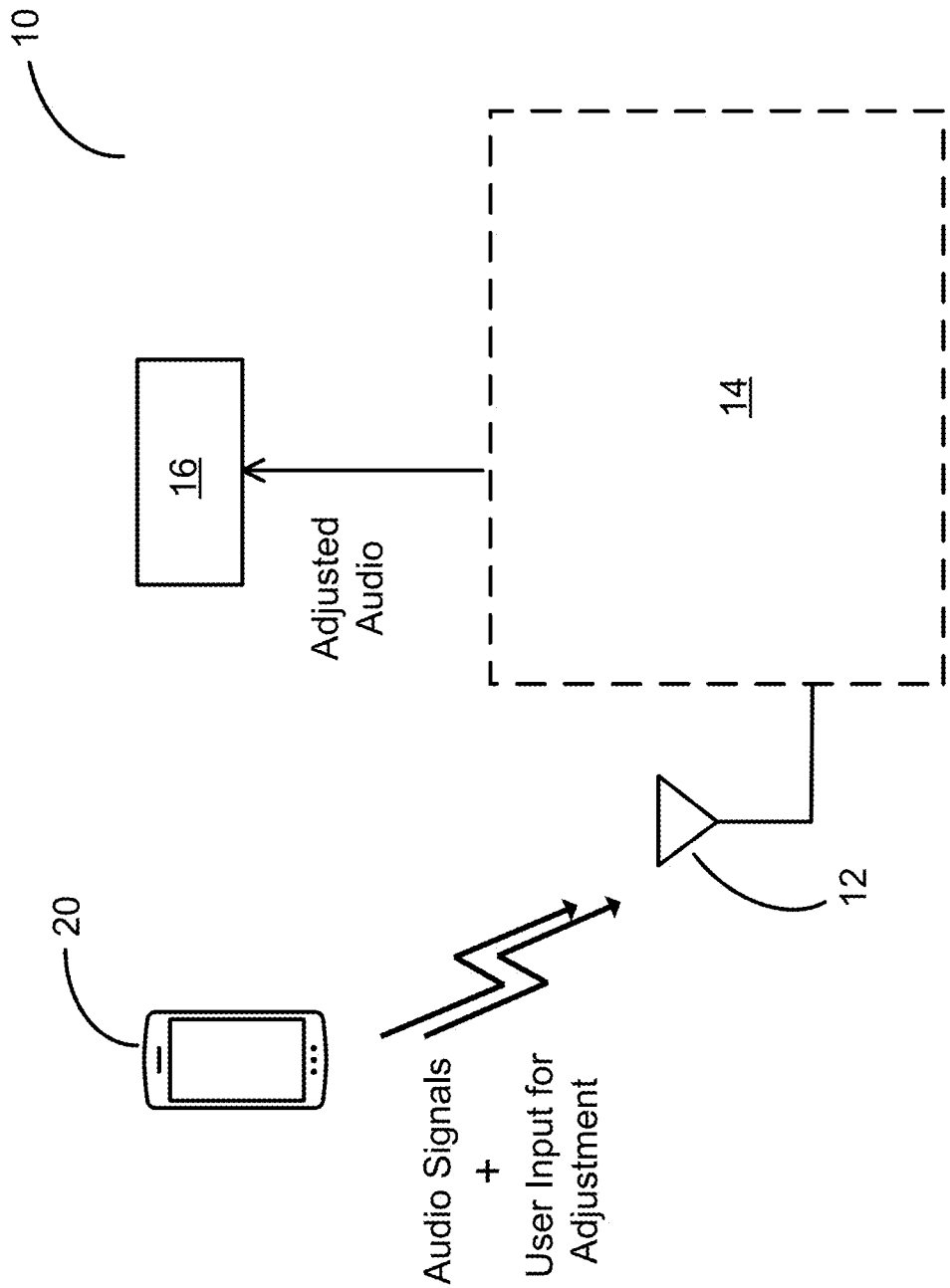
FIG. 1 illustrates an example of the prior art scheme to control the audio settings for the sound/music listened to by a user using a speaker device.

FIG. 1 illustrates an example of the prior art scheme to control the audio settings for the sound/music listened to by a user using a speaker device 10. An audio source 20, shown as a smartphone in FIG. 1, may be installed with an application enabling the user to input his/her controls via a user interface associated with the audio source 20, e.g., a touch screen of the smartphone. Here, an "application" refers to a computer software or firmware program designed to perform functions and tasks for the audio listening. In one conventional configuration, the user inputs are made at the audio source 20 by using the application, the audio signals are adjusted according to the user inputs at the audio source 20, and thereafter the adjusted audio signals are transmitted from the audio source 20 to an antenna 12 of the speaker device 10, where the adjusted audio signals are processed by a processor in a circuit 14 integrated on a chipset, e.g., a Bluetooth chipset, in the speaker device 10. In another conventional configuration, the user inputs are made at the audio source 20 by using the application, the audio signals and the signals corresponding to the user inputs are transmitted from the audio source 20 to the antenna 12 of the speaker device 10, and thereafter the audio signals are adjusted according to the user input signal and processed by a processor in a circuit 14 integrated on a chipset, e.g., a Bluetooth chipset, in the speaker device 10. Thereafter, in either of the above configurations of the prior art, the adjusted audio signals are sent to a speaker driver 16 such as a transducer of the speaker device 10 to generate vibrations, i.e., the sound corresponding to the adjusted audio signals, for the user to listen to. Thus, in the prior art scheme, the user inputs to control the sound attributes, such as the volume and EQ settings, are inputted at the audio source 20 by means of the application, which is specifically designed for the audio listening and installed in the audio source 20 such as a smartphone.

In contrast to the above conventional schemes, the present scheme provides more user-friendly and efficient sound controls based on implementations directly in a new type of speaker devices, enabling users to control the sound attributes, in particular, the equalization (EQ) setting, directly on the speaker device. Examples of speaker devices may include a pair of earbuds or earphones, a headset having a pair of headphones, wearables, and other hand-free audio listening devices. Details of the present speaker devices are explained below with reference to accompanying drawings FIGS. 2-5C.

Figure 2:
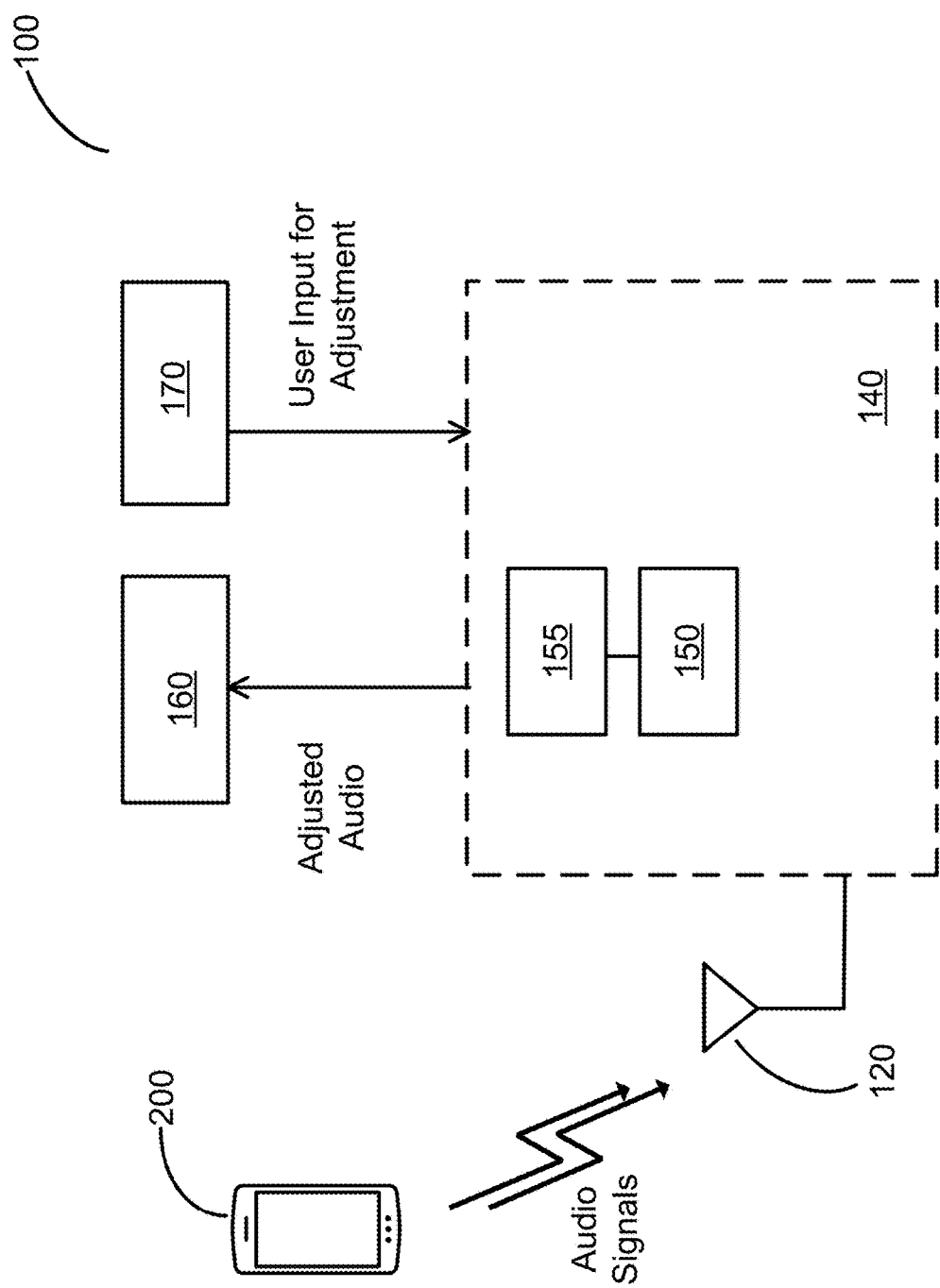
FIG. 2 illustrates an example of the present scheme, according to an embodiment, to control the audio settings for the sound/music listened to by a user using a speaker device.

FIG. 2 illustrates an example of the present sound control scheme, according to an embodiment, to control the audio settings for the sound/music listened to by a user using a speaker device 100. In this example, the speaker device 100, such as a pair of earbuds or earphones or a headset having a pair of headphones, includes an antenna 120 to receive the audio signals from an audio source 200, shown as a smartphone in FIG. 2. Here, one or more separate antennas are collectively called the antenna 120, which may be configured to receive or to receive and transmit RF signals based on a short-range wireless communication protocol, e.g., the Bluetooth protocol. In the case where a wired communication link is used for the short-range communication, the speaker device 100 may have a connector, instead of the antenna 120, to connect to one end of the wire, which is connectable to the audio source 200 at the other end, to receive the audio signals. Thus, the antenna 120 or the connector serves as an audio receiving port to receive audio signals from the audio source 200 based on the short-range communication link, wireless or wired, respectively, and is electronically coupled to a circuitry 140 internal to the speaker device 100. The circuitry 140 may be integrated or partially integrated with some discrete components, being mounted on a PCB or a chipset, for processing electronic signals including the audio signals. For example, the circuitry 140 may be mounted on a Bluetooth chipset for processing Bluetooth-based RF signals. As mentioned earlier, the antenna 120 may comprise one or more separate antennas, among which at least one or part may be integrated with the circuitry 140 and the others may be external to the circuitry 140, all may be integrated, or all may be external. To receive the audio signals from the audio source 200, at least one or part of the antenna 120 is configured to be a receiver antenna. In case a microphone is incorporated with the speaker device 100, at least another one or part of the antenna 120 is configured to be a transmitter antenna for transmitting out the voice signal or other output signals. Alternatively, at least one or part of the antenna 120 may be configured to be duel, i.e., functioning both as a receiver antenna and a transmitter antenna.

The circuitry 140 includes at least a processor 150 and a memory 155 coupled thereto. The processor 150 executes one or more software or firmware programs having computer executable instructions on the memory 155 for controlling various parts and performing tasks to process the electronic signals including the audio signals. Information and data necessary for the signal processing can be stored in the memory 155, and retrieved or updated as needed. After the processing at the circuitry 140, the processed audio signals are sent to a speaker driver 160 such as a transducer to generate vibrations, i.e., the sound corresponding to the processed audio signals, for the user to listen to.

As mentioned earlier with reference to FIG. 1, in the prior art scheme, the user inputs to control the sound attributes, such as the volume and EQ settings, are inputted at the audio source 20 by means of the application, which is specifically designed for the audio listening and installed in the audio source 20 such as a smartphone. In contrast, the present scheme utilizes the speaker device 100 that is configured to directly and locally receive user inputs for sound adjustments. Accordingly, the user may not have to divert his/her attention from the audio listening for opening the application and searching for control tabs or pages to adjust the sound, and may be able to experience less latency and better efficiency in hearing the adjusted sound in response to his/her command.

In the present configuration, the user inputs for adjusting the sound attributes such as the volume and EQ settings, are made at a user input (UI) terminal 170 associated with a touch sensor or a button, for example. Each user input action, such as single touching, double touching, short pushing, long pushing, etc., is detected at the UI terminal 170, and the corresponding user input signal is sent to the circuitry 140 to be used for processing the audio signals by the processor 150. The audio setting corresponding to the input signal is retrieved from the memory 155. On the other hand, the original audio signals are received at the audio receiving port such as the antenna 120 from the audio source 200. The audio signals are then sent to the circuitry 140 to be processed by the processor 150. The received original audio signals can be adjusted according to the audio setting corresponding to the user input signal. The processed audio signals are then sent to the speaker driver 160. Additionally, an audio prompt corresponding to the user input signal can be retrieved from the memory 155, and sent to the speaker driver 160 for notifying the user of the selected setting. Thus, the user can listen to the sound according to the audio setting he/she selected as well as the audio prompt notifying him/her of the selected setting. The audio prompt can be a voice prompt saved in an audio file and stored in the memory 155. Alternatively, the audio prompt can be a beep or beeps, long or short, emitted corresponding to the audio setting.

Equalization requires advanced audio processing algorithms and architecture in order to adjust the frequency response, i.e., the amplitudes of the sound waves in a specific frequency range, according to the user's command. For example, bass boost or down requires adjustment of the amplitudes of low-frequency sound waves, treble boost or down requires adjustment of the amplitudes of high-frequency sound waves, and vocal boost or down requires adjustment of the amplitudes of vocal-band waves. The user may want to get back to a balanced EQ, may want to adjust both the bass and the vocal, may want to repeat the same EQ setting, etc. In other cases, the strength of the amplitude modification may be required to be uniform over the selected frequency range; or a certain modification form, e.g., a sine-wave like form or a random variation in the strength of the amplitude modification, may be required over the selected frequency range. Thus, there can be multiple EQ settings corresponding to multiple different frequency responses, respectively, depending on general users' likings.

Figure 3:
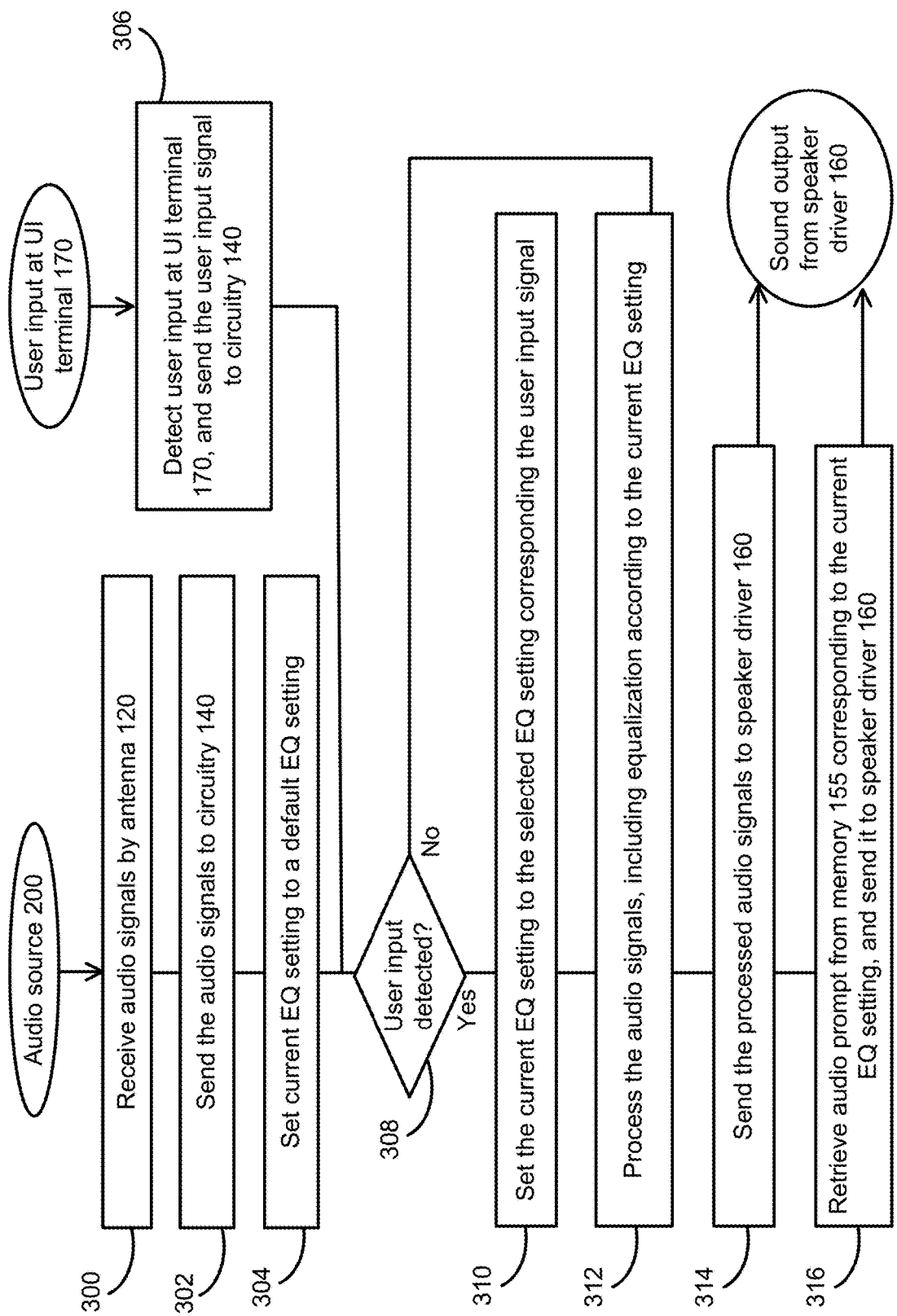
FIG. 3 is a flowchart showing the process of generating the sound adjusted according to a user input by using the speaker device, according to an embodiment.

FIG. 3 is a flowchart showing the process of generating the sound adjusted according to a user input by using the speaker device 100, according to an embodiment. The sound may be music; the speaker device 100 may be a pair of earbuds or earphones, or a headset having a pair of headphones. This process depicts a specific example in which a wireless communication is used between the audio source 200 and the speaker device 100; and the sound attribute that the user wants to adjust is the EQ setting. It should be noted here that the order of steps in the flowcharts illustrated in this document may not have to be the same as the order that is shown, unless otherwise specified. Some steps can be interchanged or sequenced differently depending on efficiency of operations, convenience of implementations or any other scenarios.

First, the power is turned on at the speaker device 100, and the hand shaking between the audio source 200 and the speaker device 100 is established. In step 300, the audio signals transmitted from the audio source 200 are received by the antenna 120 of the speaker device 100. In step 302, the received audio signals are sent to the circuitry 140 for processing. Generally, the audio signals are converted to digital in form to be processed in the circuitry 140, and converted back to analog in form to be outputted from the terminals or ports of the circuitry 140. The circuitry 140 includes at least the processor 150 and the memory 155 coupled thereto. The processor 150 executes one or more software or firmware programs having computer executable instructions on the memory 155 for controlling various parts and performing tasks to process the electronic signals including the audio signals. Information and data necessary for the signal processing, such as multiple frequency response formats corresponding to multiple EQ settings, respectively, may be prestored in the memory 155. That is, the multiple EQ settings may be stored in the memory 155 as multiple frequency response formats, respectively. Examples of the frequency response formats may include a set of parameters specifying a predetermined frequency range for the amplitude modification, a predetermined amount of increase or decrease in the strength of the amplitude modification, a predetermined form of the modification (uniform or balanced, sine-wave like, random, etc.) over the predetermined range, etc. Initially, in step 304, the current EQ setting can be set to a predetermined initial EQ setting, e.g., a default EQ setting. Examples of the default EQ setting may include: a popular EQ setting among users; a balanced EQ by which the original frequency response is retained or a uniform increase or decrease in amplitude of the sound waves is made for the entire frequency range; and a specific EQ setting selected by the user before turning off the speaker device 100 last time, in which case the assignment to the selected EQ setting was retained in the memory and can be retrieved in step 304 as the initial EQ setting.

As mentioned earlier, in the present scheme using the speaker device 100, the user inputs for adjusting the sound attributes such as the volume and EQ setting, are made at the user input (UI) terminal 170 associated with a touch sensor or a button, for example. Each user input, such as single touching, double touching, short pushing, long pushing, etc., is detected at the UI terminal 170, and the corresponding user input signal is sent to the circuitry 140. Generally, user input signals are converted to digital in form to be processed in the circuitry 140. In step 308, it is judged by the processor 150 if a user input is detected at the UI terminal 170. If yes, in step 310, the current EQ setting is set to the selected EQ setting corresponding to the user input signal. If no, the current EQ setting is kept to the initial EQ setting, e.g., a default EQ setting, and the process proceeds to step 312.

In step 312, the audio signals are processed by the processor 150, wherein the audio processing includes equalization according to the current EQ setting. The processor 150 may be configured to include a DSP (digital signal processor) for advanced audio signal processing. As mentioned earlier, multiple frequency response formats corresponding to multiple EQ settings, respectively, may be prestored in the memory 155. The frequency response format corresponding to the current EQ setting, which may be the default EQ setting or the selected EQ setting corresponding to the user input signal, may be retrieved from the memory 155 by the processor 150 and applied to the audio processing. The equalization is thus carried out by processing the audio signals to have the frequency response corresponding to the current EQ setting. After the processing, in step 314, the processed audio signals are sent to the speaker driver 160, which may be a transducer to generate vibrations, i.e., the sound corresponding to the processed audio signals, for the user to listen to.

There are a wide variety of EQ settings conceivable; however, incorporating too many EQ settings will make it too complex for general users to navigate. Thus, the number of EQ settings, hence the number of corresponding frequency response formats, may have to be limited to a few, e.g., 3, 4 or 5. Different user input actions may be assigned to different EQ settings, respectively. Alternatively, it may be desirable if a single user input action allows the user to switch from one EQ setting to another. For these reasons, a predetermined multiple numbers of EQ settings, e.g., three most popular EQ settings A, B and C (e.g., bass boost, vocal-and-bass boost and balanced) may be prestored, and configured to be selected sequentially and cyclically, i.e., A-B-C-A-B- . . . and so on each time the specific user input action is performed. The default EQ setting may be specific one of them or the last EQ setting selected and set before the user turned off the power last time. Examples of the specific user input action may include: press and hold the touch sensors at both the earbuds simultaneously for longer than a predetermined time period, e.g., 3 seconds; triple touching the touch sensor of one of the earbuds; simultaneous pressing both volume + and volume − buttons implemented in a control box connecting both the earbuds; simultaneously pressing both volume + and volume − buttons implemented at one side of the headset; and various other actions using a touch sensor or a button associated with the UI terminal 170.

In addition to multiple frequency response formats as the multiple EQ settings, multiple audio prompts corresponding to the multiple EQ settings may be predetermined and stored in the memory 155. Audio prompts may be in the form of different voice prompts, respectively, saved as an audio file in the memory 155. For example, the audio file may include voices emitting words "bass boost," "vocal and bass boost" and "balanced" or other voice indicia corresponding to the three EQ settings in the present case. Alternatively, an audio prompt may be a beep or beeps, long or short, emitted according to the beep type assignment predetermined and stored in the memory 155. For example, one beep, two beeps and three beeps may be assigned to the three EQ settings, respectively. In step 316, the audio prompt corresponding to the user input signal is retrieved from the memory 155, and sent to the speaker driver 160 for notifying the user of the current EQ setting. Thus, the user can listen to the sound processed according to the EQ setting he/she selected as well as to the audio prompt notifying him/her of the selected EQ setting. Both the processed sound and the audio prompt are outputted from the speaker driver 160.

Figure 4:
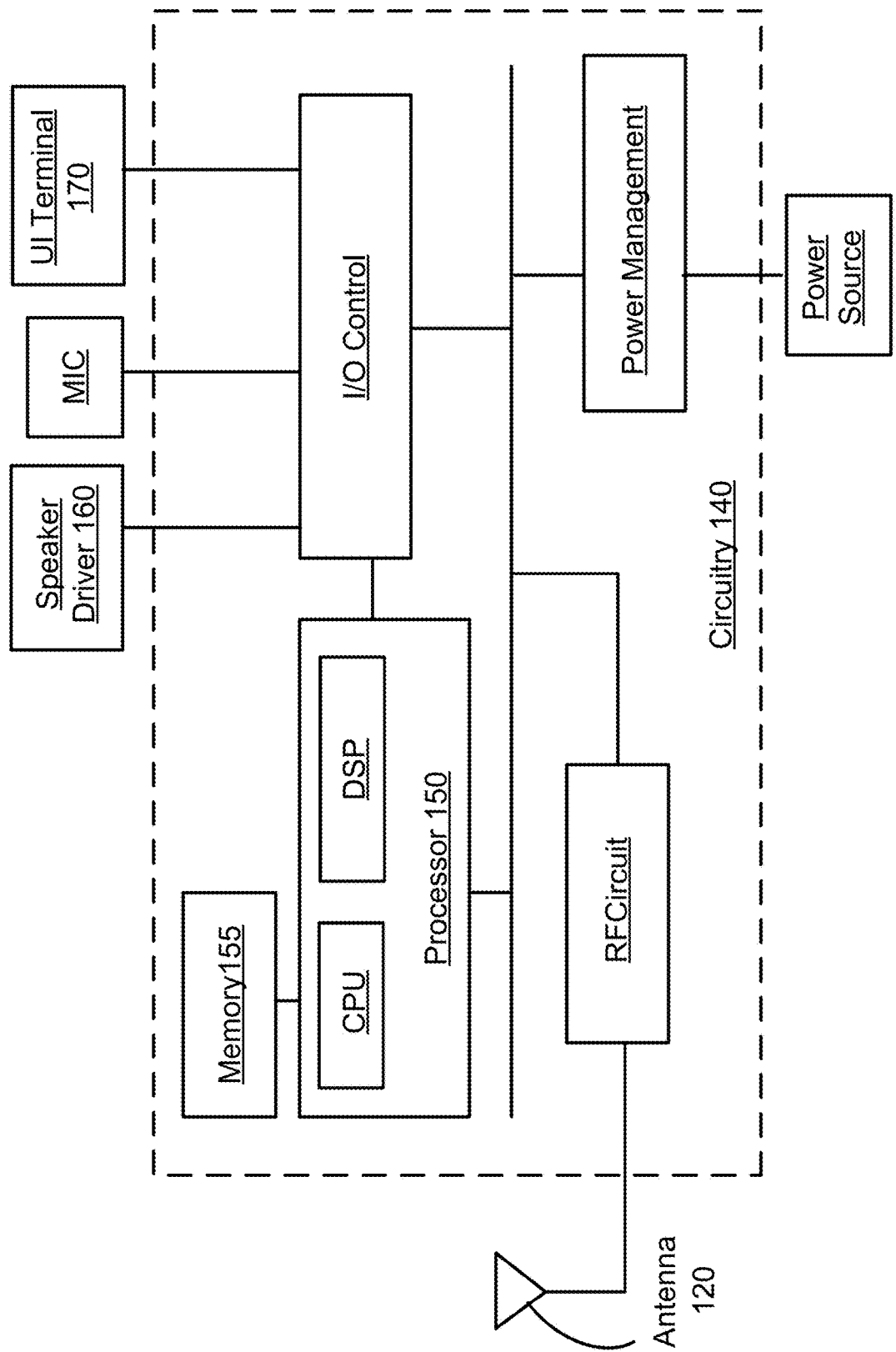
FIG. 4 is a block diagram illustrating an example of the electronic configuration in detail of the present speaker device.

FIG. 4 is a block diagram illustrating an example of the electronic configuration in detail of the present speaker device 100. This is a specific example using a wireless communication between the audio source 200 and the speaker device 100, based, for example, on the Bluetooth protocol and using a chipset designed to handle the Bluetooth-based RF signals. The RF signals are received by the antenna 120 from the audio source 200. Here, one or more separate antennas are collectively called the antenna 120, among which at least one or part may be integrated with the circuitry 140 and the others may be external to the circuitry 140, all may be integrated, or all may be external. To receive the audio signals from the audio source 200, at least one or part of the antenna 120 may be configured to be a receiver antenna. The configuration exemplified in FIG. 4 includes a microphone (MIC); thus, at least another one or part of the antenna 120 is configured to be a transmitter antenna for transmitting out the voice or other signals inputted from the MIC. Depending on the frequency ranges and communication methods, one antenna may serve dual, i.e., functioning as both a receiver antenna and a transmitter antenna. The MIC, the speaker driver 160 such as a transducer, the UI terminal 170 associated with a touch sensor or a button, a power source such as a battery, and other terminals or ports are coupled to the circuitry 140. A USB port or other communication port may be used to directly couple the circuitry 140 with an external device, such as a smart phone, a laptop computer, a tablet, a digital audio player (DAP), etc. via a wired communication link, instead of the wireless communication link, for preforming the short-range communication with the audio source.

The circuitry 140 may be integrated or partially integrated with some discrete components, being mounted on a PCB or a chipset, to process electronic signals including the audio signals. An example of the circuitry 140 may be formed as a Bluetooth chipset for processing Bluetooth-based RF signals. The audio signals received by the antenna 120 are sent to an RF circuit that may include: an RF front-end module having power amplifiers, low-noise amplifiers and filters, a mixer and an associated oscillator, a baseband processor including modulation/demodulation, and other RF electronic components. The audio signals are generally converted in form to digital in the RF circuit to be processed by the processor 150. The power provided by the power source such as a battery is managed by a power management circuit that may include: a charger, regulators and power converters to properly power up all the parts and components. The circuitry 140 also includes an I/O control block that may include: a digital-to-analog converter (DAC), an analog-to-digital converter (ADC), a serial peripheral interface (SPI), an inter-integrated circuit (I2C) serial bus, an inter-IC sound (I2S) serial bus, and other interface components for input and output controls. The DAC may be used to convert the digital audio signals processed by the processor 150 to analog audio signals for coupling to a transducer of the speaker driver 160. The ADC may be used to convert analog audio signals detected by the MIC to digital audio signals for processing by the processor 150. The SPI, I2C and/or I2S may be used to provide the interface between the processor 150 and the parts such as the DAC and the ADC. The user input signal detected at the UI terminal 170 may also be converted to digital in form at the ADC or other suitable converter in the I/O control block to be processed by the processor 150.

The RF circuit may be in communication with the processor 150 for the audio signals to be processed. The processor 150 in the specific example depicted in FIG. 4 includes a CPU that functions as the brain/core of the circuitry 140 for controlling various parts and a digital signal processor (DSP) for advanced processing of digitized audio signals based on algorithms and architecture specifically designed for measuring, filtering, compressing, decompressing and other manipulations. The processor 150 is coupled with the memory 155, which may include RAM, ROM, flash memory, etc., to store data and computer executable instructions to be fetched by the processor 150 to execute one or more software or firmware computer programs. In a specific case of equalization, the processor 150 may be configured to execute one or part of the software or firmware computer programs having computer executable instructions on the memory 155 to set the frequency response of the audio signals according to one of the frequency response formats stored in the memory 155, the one being retrieved as a default EQ setting or a selected EQ setting according to the user input signal detected at the UI terminal 170. The memory 155 may also include a buffer to handle latency or synchronization issues in audio signals.

Figure 5A:
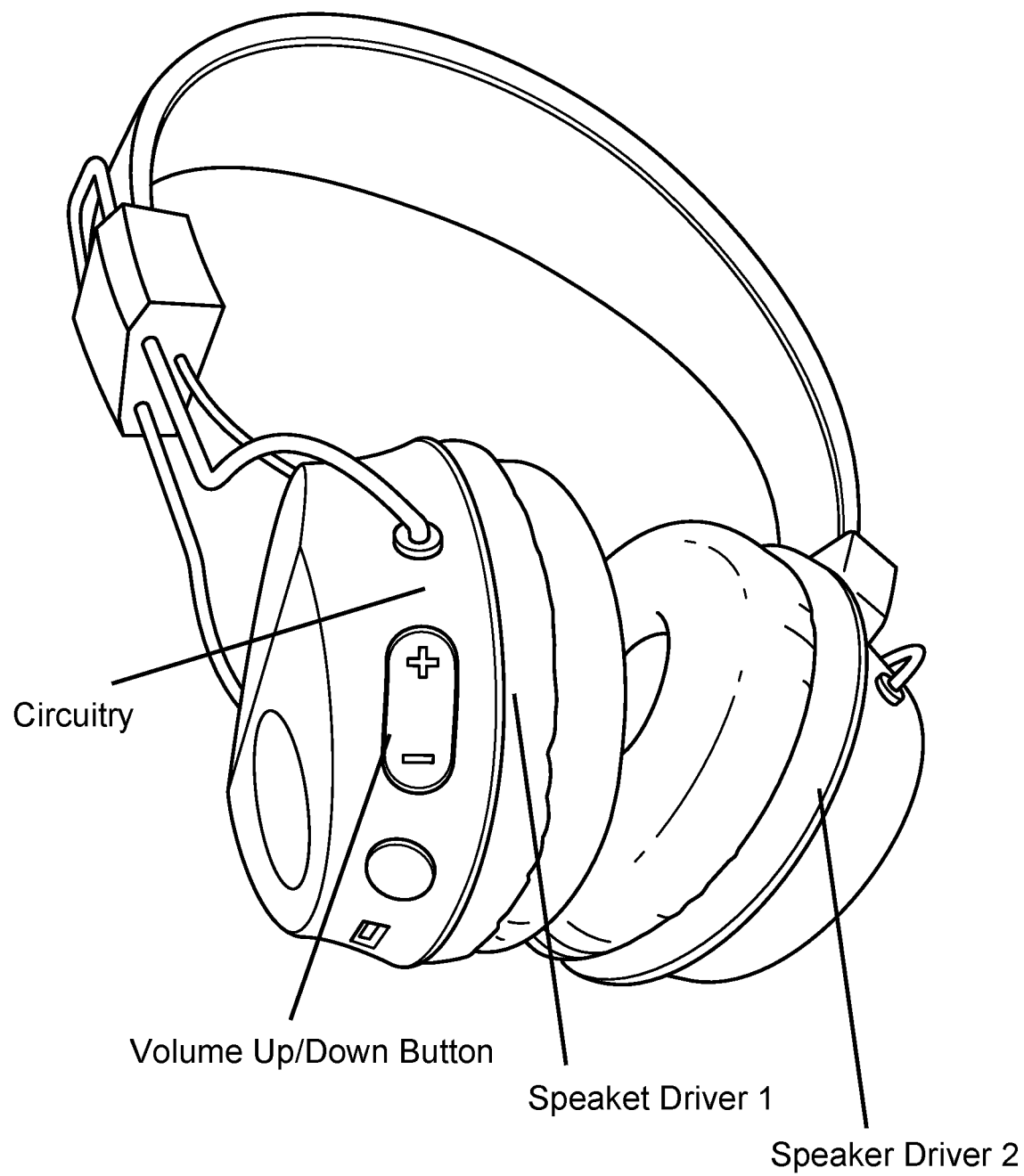
FIGS. 5A, 5B and 5C are photos of example speaker devices, each having the present EQ control scheme implemented directly therewith.
Figure 5B:
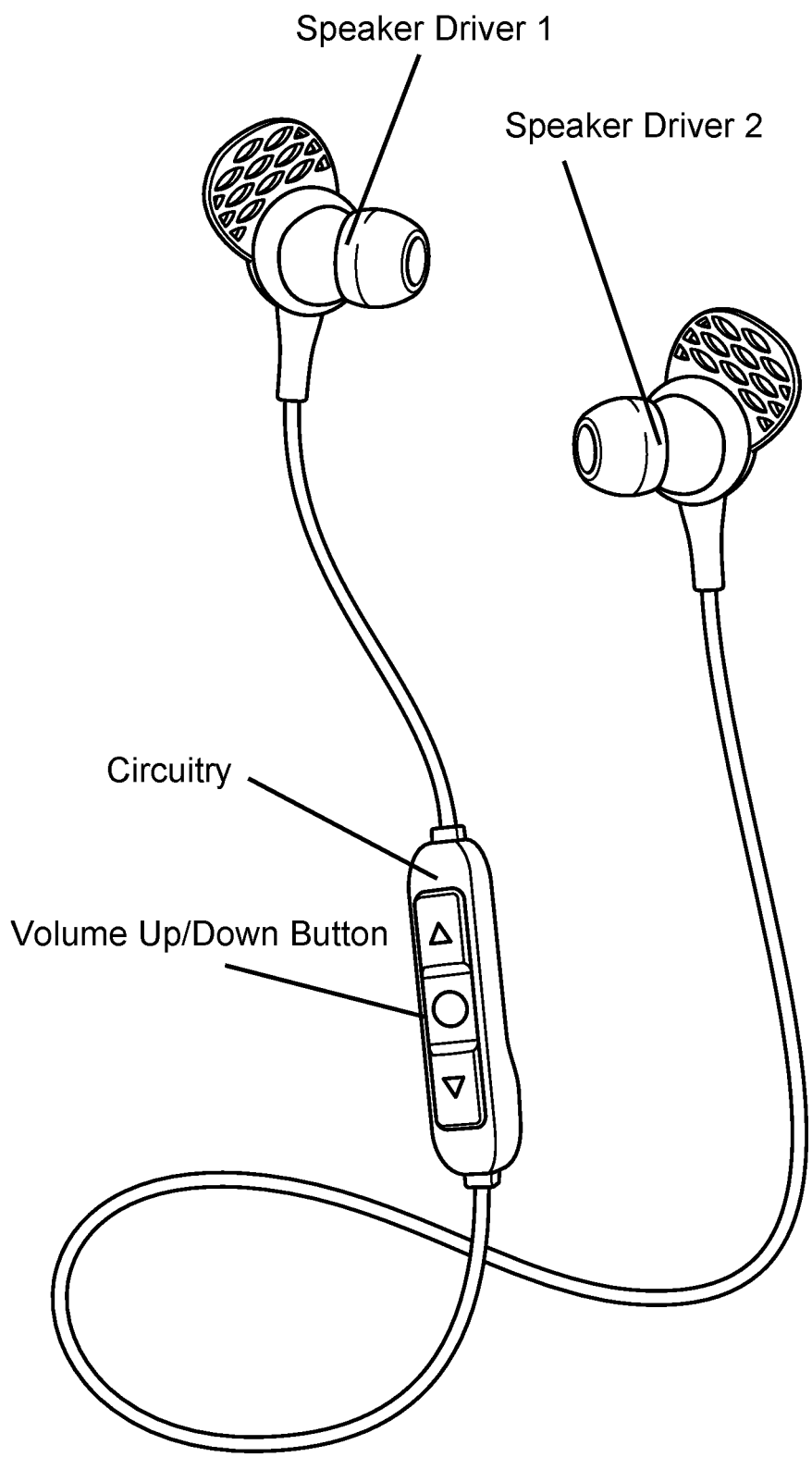
Figure 5C:
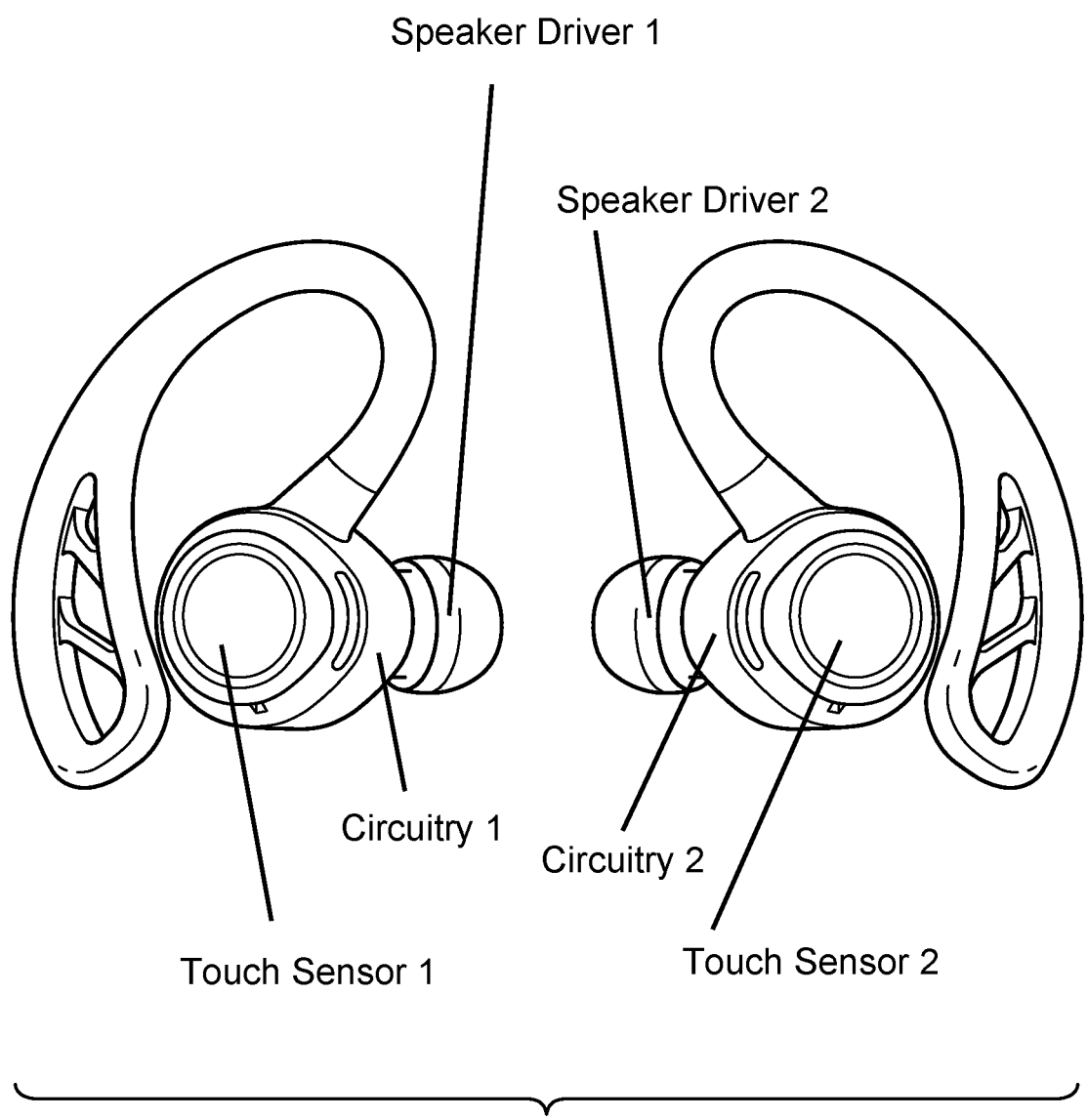

FIGS. 5A, 5B and 5C are photos of example speaker devices, each having the present EQ control scheme implemented directly therein. FIG. 5A shows a headset having a pair of headphones coupled via a wired communication link. The pair of headphones include speaker drivers 1 and 2, respectively, to emit sound for the user to listen to. One of the headphones includes a chipset or a PCB having the circuitry to handle the audio processing, and is configured to communicate with an audio source wirelessly or by an electric wire via a USB, for example. The present headset includes a volume up/down (±) button having an up control section and a down control section, on the one of the headphones, enabling the user to increase and decrease the volume of the sound. Three most popular EQ settings A, B and C (e.g., bass boost, vocal-and-bass boost and balanced) may be prestored in the memory of the circuitry and configured to be selected sequentially and cyclically, i.e., A-B-C-A-B- . . . and so on, each time the user presses and holds both the volume up and down control sections of the button simultaneously for longer than a predetermined period of time, e.g., 1 second. The default EQ setting may be specific one of them or the last EQ setting selected and set before the user turned off the power last time. In the present headset, the audio signals are received and processed at the one of the headphones having the volume up/down button and the circuitry therein, which serves as a master; the processed audio signals are then transmitted via the wired communication link to the other headphone, which serves as a slave. The processed audio signals with the current EQ setting are thus emitted as the sound with the current EQ setting from the speaker drivers 1 and 2 of both the headphones.

FIG. 5B shows a pair of earbuds coupled via a wired communication link having a common control box. The earbuds include speaker drivers 1 and 2, respectively, to emit sound for the user to listen to. The control box includes a chipset or a PCB having the circuitry to handle the audio processing. The control box may include an antenna coupled to the circuitry for receiving audio signals from an audio source wirelessly. The present control box includes a volume up/down button having an up control section and a down control section, enabling the user to increase and decrease the volume of the sound. Three most popular EQ settings A, B and C (e.g., bass boost, vocal-and-bass boost and balanced) may be prestored in the memory of the circuitry, and configured to be selected sequentially and cyclically, i.e., A-B-C-A-B- . . . and so on each time the user presses both the volume up and down control sections of the button simultaneously. The default EQ setting may be specific one of them or the last EQ setting selected and set before the user turned off the power last time. In the present pair of earbuds, the audio signals are received and processed at the control box having the volume up/down button and the circuitry therein. The processed audio signals with the current EQ setting are thus transmitted via the wired communication link to, and emitted as the sound with the current EQ setting from, the speaker drivers 1 and 2 of both the earbuds.

FIG. 5C shows a pair of earbuds configured to couple to each other via a wireless communication link. The pair of earbuds include, respectively: speaker drivers 1 and 2 to emit sound for the user to listen to, circuitry 1 and 2 to handle audio signals and touch sensors 1 and 2 to sense the user input for audio controls. Each earbud may include one or more antennas to communicate with an audio source wirelessly as well as to mutually communicate wirelessly. Such a "true wireless" pair of earbuds may be configured to utilize a master-slave configuration or a direct configuration. In the master-slave configuration, one of the earbuds, e.g., the one that the user already touched to power up, may serve as the master to first receive audio signals from an audio source, and then the received audio signals may be transmitted to the other earbud, i.e., the slave, through the mutual wireless communication link. If the latency or synchronization issues exist, a buffer may be incorporated in the memory of the circuit to optimize the stereo effects and comfort for human ears. In the direct configuration, the audio signals may be received by the antennas at both the earbuds, respectively and individually, processed by the circuitry 1 and 2, respectively and individually, and sent to the speaker drivers 1 and 2, respectively and individually. Three most popular EQ settings A, B and C (e.g., bass boost, vocal-and-bass boost and balanced) may be prestored in the memory of the circuitry of each earbud, and configured to be selected sequentially and cyclically, i.e., A-B-C-A-B- . . . and so on each time the user provides a user input action. The default EQ setting may be specific one of them or the last EQ setting selected and set before the user turned off the power last time. Examples of the user input action to switch from one EQ setting to another may include: pressing the touch sensors 1 and 2 simultaneously at both the earbuds for longer than a predetermined period of time, e.g., 3 seconds; or triple clicking the touch sensor at one of the earbuds. The user input signal corresponding to the user input action is mutually communicated between the pair of earbuds via the wireless mutual communication link. In either the master-slave configuration or the direct configuration, the audio signals may be processed substantially simultaneously by the processors at both the earbuds to have the current EQ setting corresponding to the user input action, and emitted as the sound with the current EQ setting from the speaker drivers 1 and 2 of both the earbuds.

According to the present EQ control scheme, as exemplified in the above scenarios, a user can adjust the sound equalization by providing a predetermined user input action to the UI terminal in the speaker device, to select one of the multiple EQ settings prestored in the memory. The selection can be made sequentially and cyclically each time the UI terminal detects the predetermined user input action. The UI terminal may be associated with one or more sensing elements, such as buttons, touch sensors, etc., each of which is configured to sense the user's finger pressing it based on the pressure or temperature, for example. Examples of the predetermined user input action may include: pressing one of the sensing elements once, twice, three times, or more; pressing one of the sensing elements longer than a predetermined period of time; simultaneously pressing and holding two sensing elements (e.g., two touch sensors or buttons on the right and left earbuds) for longer than a predetermined period of time; pressing two or more sensing elements in a predetermined sequence (e.g., right-left, right-right-left, right-left-right, etc. using the right and left touch sensors); simultaneously pressing and holding a predetermined combination of two, three or more sensing elements (e.g., No. 1 and No. 2 buttons out of three buttons on a headphone) for longer than a predetermined period of time.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

What is claimed is:

1. A speaker device with equalization control, wherein the speaker device comprises a headset having a pair of headphones coupled via a wired communication link, a pair of earbuds coupled via a wired communication link, or a pair of earbuds coupled via a wireless mutual communication link, and is configured to communicate with an audio source based on a short-range communication link, the speaker device comprising:

an audio receiving port for receiving audio signals from the audio source based on the short-range communication link;

a circuitry comprising at least a processor and a memory coupled thereto, the processor being configured to execute one or more firmware or software programs having computer executable instructions on the memory to perform tasks for processing the audio signals, including equalization of the audio signals according to one of a plurality of equalization (EQ) settings stored in the memory;

a user input terminal configured to detect a user input for adjusting sound attributes including the equalization and to send a corresponding user input signal to the circuitry for selecting and setting the EQ settings; and a pair of speaker drivers respectively included in the pair for emitting sound corresponding to the processed audio signals.

2. The speaker device of claim 1, wherein the speaker device comprises the headset having a pair of headphones coupled via the wired communication link, wherein one of the headphones includes the circuitry for processing the audio signals including the equalization and the user input terminal for detecting the user input.

3. The speaker device of claim 1, wherein the speaker device comprises the pair of earbuds coupled via the wired communication link having a control box, wherein the control box includes the circuitry for processing the audio signals including the equalization and the user input terminal for detecting the user input.

4. The speaker device of claim 1, wherein the speaker device comprises the pair of earbuds coupled via the wireless mutual communication link, wherein each of the pair of earbuds includes one or more antennas as the audio receiving port for wirelessly receiving audio signals from the audio source and for mutually communicating wirelessly, the circuitry for processing the audio signals including the equalization and the user input terminal for detecting the user input.

5. The speaker device of claim 4, wherein
   the user input signal corresponding to the user input is mutually communicated between the pair of earbuds via the wireless mutual communication link, and the audio signals are processed by the processors at both the earbuds individually.

6. The speaker device of claim 1, wherein
   the audio receiving port of the speaker device is configured to receive audio signals from the audio source wirelessly based on Bluetooth protocol.

7. The speaker device of claim 1, wherein
   the audio receiving port of the speaker device is configured to receive audio signals from the audio source based on a wired link.

8. The speaker device of claim 1, wherein
   a plurality of frequency response formats as the plurality of EQ settings, respectively, are stored in the memory; and
   the processor is configured to perform the equalization by setting a frequency response of the audio signals according to one of the plurality of frequency response formats corresponding to the one of the plurality of EQ settings.

9. The speaker device of claim 1, wherein the one of the plurality of EQ settings is a default EQ setting or a selected EQ setting according to the user input signal.

10. The speaker device of claim 9, wherein
the default EQ setting is a predetermined one of the plurality of EQ settings or the EQ setting selected by a user before turning off the speaker device last time; and
the selected EQ setting is retrieved sequentially and cyclically from the plurality of EQ settings stored in the memory each time the user input corresponding to a predetermined user input action is detected.

11. The speaker device of claim 10, wherein
the one of the plurality of EQ settings is the selected EQ setting, and wherein the user input terminal is associated with one or more sensing elements to sense the predetermined user input action.

12. The speaker device of claim 11, wherein
the sensing element includes a touch sensor or a button for sensing the user's finger pressing it.

13. The speaker device of claim 11, wherein
the predetermined user input action comprises: pressing one of the one or more sensing elements one or more times or for longer than a predetermined period of time.

14. The speaker device of claim 11, wherein
the one or more sensing elements include two or more sensing elements, and wherein the predetermined user input action comprises: simultaneously pressing and holding two or more sensing elements for longer than a predetermined period of time.

15. The speaker device of claim 11, wherein
the one or more sensing elements include two or more sensing elements, and wherein the predetermined user input action comprises: pressing two or more sensing elements in a predetermined sequence.

16. The speaker device of claim 10, wherein
the speaker device comprises a pair of earbuds coupled via a wireless mutual communication link,
wherein the one of the plurality of EQ settings is the selected EQ settings, and wherein the user input signal corresponding to the predetermined user input action is mutually communicated between the pair of earbuds via the wireless mutual communication link, and the audio signals are processed by the processors at both the earbuds individually to have the selected EQ setting corresponding to the user input signal.

17. The speaker device of claim 1, wherein
a plurality of audio prompts corresponding to the plurality of EQ settings, respectively, are stored in the memory; and
the processor is configured to retrieve from the memory one of the audio prompts corresponding to the user input signal, and send it to the speaker drivers for notifying a user of the one of the EQ settings corresponding to the user input signal.

18. The speaker device of claim 17, wherein
the plurality of audio prompts are configured to be a plurality of different voice prompts, respectively.

19. The speaker device of claim 17, wherein
the plurality of audio prompts are configured to be a plurality of different numbers or types of beeps, respectively.

20. The speaker device of claim 1, wherein
the plurality of EQ settings comprise three EQ settings, respectively, for increasing amplitudes of the audio signals in a low-frequency bass range, for increasing amplitudes of the audio signals in a vocal-band range and a low-frequency bass range, and for having balanced amplitudes of the audio signals.

* * * * *